(12) United States Patent
Holbery et al.

(10) Patent No.: US 11,091,855 B2
(45) Date of Patent: Aug. 17, 2021

(54) ELECTRONICALLY FUNCTIONAL YARN AND TEXTILE

(71) Applicant: Microsoft Technology Licensing, LLC, Redmond, WA (US)

(72) Inventors: James David Holbery, Bellevue, WA (US); Siyuan Ma, Redmond, WA (US); Don Pasindu Vijai Lugoda, Colombo (LK); Timothy Jerome Coomes, Sammamish, WA (US); James Alec Ishihara, Bellevue, WA (US); Kelly Marie Bogan, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 316 days.

(21) Appl. No.: 15/707,865

(22) Filed: Sep. 18, 2017

(65) Prior Publication Data

US 2019/0085487 A1  Mar. 21, 2019

(51) Int. Cl.

| D02G 3/00 | (2006.01) |
| D02G 3/44 | (2006.01) |
| D02G 3/40 | (2006.01) |
| D02G 3/36 | (2006.01) |
| D03D 1/00 | (2006.01) |
| G03F 7/00 | (2006.01) |
| H05K 3/10 | (2006.01) |
| H05K 1/03 | (2006.01) |

(52) U.S. Cl.
CPC ............ *D02G 3/441* (2013.01); *D02G 3/36* (2013.01); *D02G 3/402* (2013.01); *D03D 1/0088* (2013.01); *G03F 7/0005* (2013.01); *H05K 1/038* (2013.01); *H05K 3/10* (2013.01); *D10B 2401/18* (2013.01); *H05K 2201/0281* (2013.01)

(58) Field of Classification Search
CPC ........................................................ D02G 3/00
See application file for complete search history.

(56) References Cited

U.S. PATENT DOCUMENTS

| 4,577,256 A * | 3/1986 | Breidegam | A61N 1/14 139/422 |
| 6,965,081 B2 * | 11/2005 | Eves | H01B 7/0009 174/105 R |
| 2004/0009729 A1 * | 1/2004 | Hill | D02G 3/441 442/208 |
| 2004/0057176 A1 * | 3/2004 | Dhawan | D02G 3/38 361/62 |

OTHER PUBLICATIONS

Definition of "Yarn" The Complete Textile Glossay, Celanese Acetate, 2001. (Year: 2001).*

* cited by examiner

*Primary Examiner* — Andrew T Piziali
(74) *Attorney, Agent, or Firm* — Alleman Hall Creasman & Tuttle LLP

(57) ABSTRACT

A yarn adaptable to incorporation into a textile comprises a core including one or more electrically conductive traces arranged on the core and distributed over at least a portion of the length of the yarn. The yarn also comprises an electrically contactable terminal arranged at a terminus of the one or more conductive traces and a winding wrapped around the core.

18 Claims, 7 Drawing Sheets

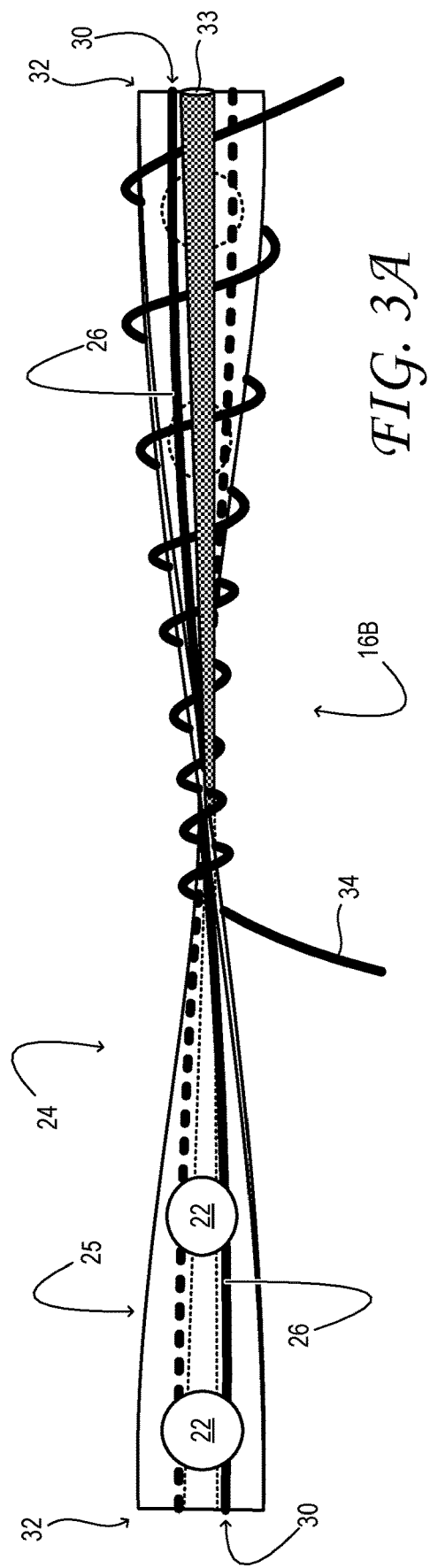
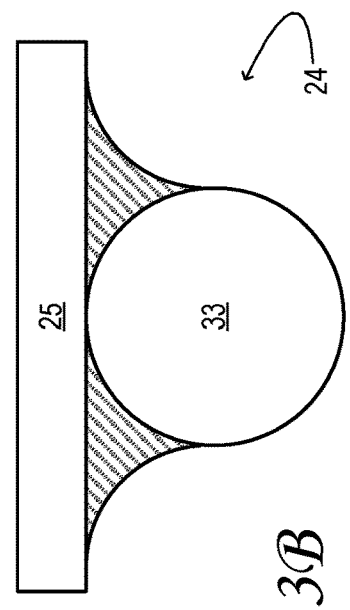
FIG. 3A
FIG. 3B

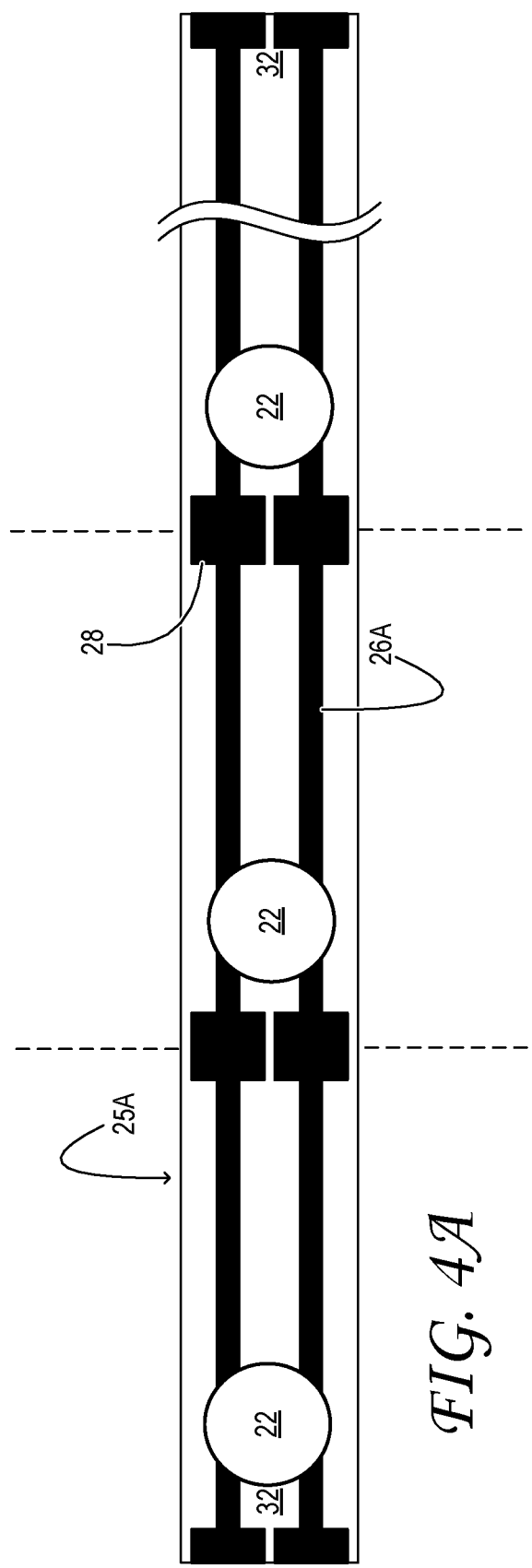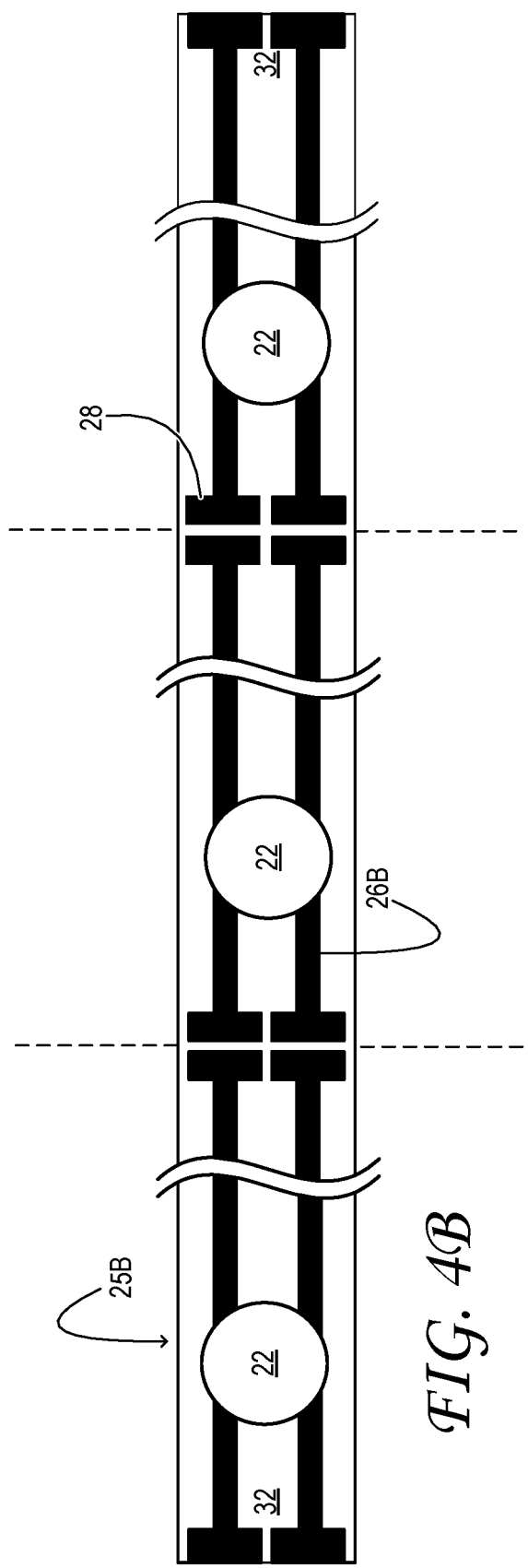

ELECTRONICALLY FUNCTIONAL YARN AND TEXTILE

BACKGROUND

Textiles are used commonly to make clothing and other coverings. By convention, a textile is a network of interlacing yarns, and a yarn is an indeterminately long assembly of wound fibers or filaments. The yarns may be interlaced by weaving, knitting, crocheting, bonding, knotting, or felting, and the resulting textile may be adapting by embroidering with additional yarn. The term 'thread' is applied to a small-diameter yarn.

A core-spun yarn is made by twisting fibers or filaments around a central filament core. In this variant, the periphery of the yarn may differ from the core, which may be selected for desirable material properties, such as strength. Peripheral fibers suitable for core-spun yarn include fibers of wool, flax, cotton, hemp, and synthetic polymers. Suitable peripheral filaments include natural silk as well as synthetics.

SUMMARY

Examples are disclosed herein that relate to a yarn adaptable to incorporation into a textile. The yarn includes a core comprising a polymer strip with one or more electrically conductive traces arranged on the polymer strip and distributed over at least a portion of a length of the yarn. The yarn also comprises an electrically contactable terminal arranged at a terminus of the one or more conductive traces and a winding wrapped around the core.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIGS. 3A and 3B show aspects of an example electronically functional yarn.

FIGS. 4A and 4B shows aspects of example yarn cores of electronically functional yarn.

DETAILED DESCRIPTION

Figure 1:
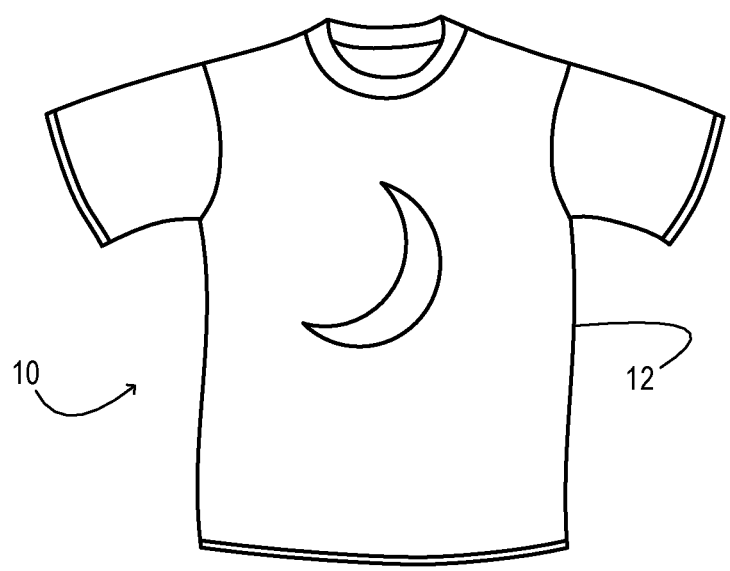
FIG. 1 shows aspects of an example electronically functional textile article.

Aspects of this disclosure will now be presented by way of example, and with reference to the drawing figures listed above. Components, process steps, and other elements that may be substantially the same in one or more of the figures are identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

There is significant current interest in technologies directed to electronically functional textiles for various articles. Such materials are referred to herein as 'electronic textiles'. The notion of building an electronic textile from the yarn level is attractive for various reasons, such as the ability to locate sensors close to the body (in the case of wearable textiles), and/or to incorporate input sensors, output devices (e.g. light emitting diodes), and haptic devices directly into the fabric (e.g. for a fabric covered computing device). Some electronically functional textiles may also include controlling logic, storage/memory components, communication components, etc. integrated into the textile.

FIG. 1 shows aspects of an electronically functional textile article in the form of a clothing article 10 formed at least partially from an electronic textile 12 made of woven yarn. Although the article here illustrated takes the form of a shirt, this disclosure applies equally to other electronically functional textile articles, such as soft-touch computing devices comprising fabric coverings, wearable computing devices (e.g. head-mounted displays, wrist-worn devices), upholstery for furnishings, wall hangings, signage and other information displays, and Internet of things (IOT) devices. As described in further detail herein, electronic textile 12 includes a plurality of active electronic-circuit components, which are embedded in the yarn from which the textile is made.

Article 10 may derive or inherit functionality from electronic textile 12. As one example, the electronic-circuit components built into the electronic textile 12 may include photodiodes configured to sense dark ambient conditions, and light-emitting diodes (LEDs) that turn on in response to the dark ambient conditions. Accordingly, article 10 in one example may be a self-illuminating shirt that makes its wearer more visible at night. Such photodiodes and LEDs are examples of discrete electronic-circuit elements that may be embedded in the yarn from which the electronic textile is made. Other examples of discrete electronic-circuit elements include temperature sensors, gas sensors, and biometric sensors—e.g., optical pulse and impedance (perspiration) sensors, among others. In other examples, integrated electronic-circuit components may be embedded in the yarn. For instance, the yarn of the electronic textile may include digital memory chips configured to store music that the wearer may access via an external media player. In that example, article 10 takes the form of a data-storage device. In still other examples, a yarn may include processing logic, such as a microprocessor configured for various applications and scenarios, such functionality being imparted to whatever textile-based article is made from that yarn. The yarn of an electronic textile may also incorporate one or more tactile feedback devices, such as a vibro-motor or other actuator.

Figure 2:
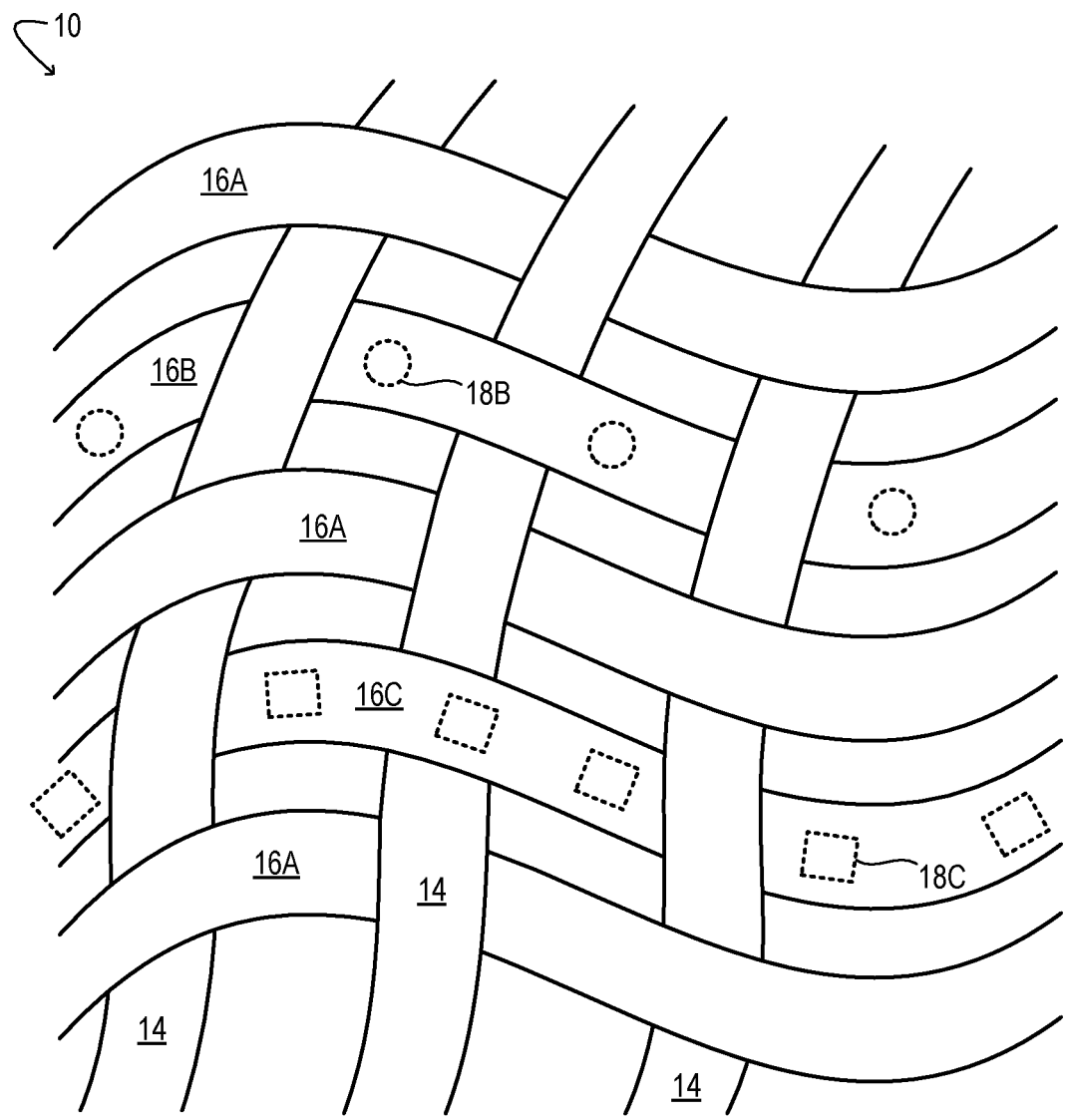
FIG. 2 shows aspects of an example electronically functional textile for use in an electronically functional textile article.

FIG. 2 shows aspects of electronic textile 12 in greater detail. More specifically, FIG. 2 shows an example weave structure of electronic textile 12. The illustrated electronic textile 12 includes a series of mutually parallel warp yarns 14, and a series of mutually parallel weft yarns 16 running perpendicular to the warp yarns 14. Either or both series may include electronically functional yarns distributed among electronically non-functional yarns, such as non-functional warp yarn 14 and non-functional weft yarn 16A. Furthermore, yarns of different electronic functionality may be incorporated together in a given textile and weave direction. For instance, a first electronically functional weft yarn 16B with embedded photodiode elements 18B may be arranged parallel to a second electronically functional weft yarn 16C with embedded LED elements 18C. Although this description refers to weaving as a way to make an electronic textile from electronically functional yarn, that aspect should not be understood in a limiting sense, for other interlacing modes are equally envisaged—knitting, crocheting, bonding, knotting, felting, and embroidering, for example.

FIG. 3A shows aspects of an electronically functional yarn (yarn 16B in this particular example), that may be incorporated into an electronic textile. For purpose of illustration, the yarn is shown unraveled. Electronically functional yarn 16B comprises a yarn core 24 including a core strip 25 that runs the length of the yarn. The core strip may be formed as a cut section of a conductor-clad polymer membrane on which a conductive pattern is formed by patterning of the conductive cladding. In some examples, the core strip may be 100 to 300 microns wide and 50 to 100 microns thick. In other examples, the core strip may have other dimensions, whether wider/narrower and/or thicker/thinner. In some examples, the core strip may be a section detached from a conductor-clad polymer-membrane sheet of suitable thickness. Materially, the polymer-membrane section may comprise an elastomer for desirable flexibility. The polymer-membrane section may comprise a silicone or urethane polymer, for example. In other examples, the polymer-membrane section may comprise a styrene-butadiene epoxy resin. In implementations in which a bendable, but not necessarily stretchable, yarn is desired, the polymer-membrane section may include polyethylene tetraphthalate (PET), polyimide (PI), and or polyethylene napthalate (PEN), for instance. Other polymers, both natural and synthetic, are also envisaged.

In these and other examples, one or more electrically conductive traces 26 are formed on the polymer-membrane section and distributed over at least a portion of the length of core strip 25. In some examples, the electrically conductive traces may comprise copper (optionally plated with another metal or material). In some examples, the electrically conductive traces may be 10 to 200 microns in width (in some cases 10 to 50 microns in width), and 1 to 5 microns thick. In other examples, the electrically conductive traces may have any other suitable dimension In the example shown in FIG. 3A, core strip 25 has opposing sides, which each may support one or more electrically conductive traces. In some examples, the traces on opposing sides of the core strip 25 may be connected by an electrically conductive via passing through the core strip, as described further below. In other examples, the electrically conductive traces may be arranged on one side only, and/or may have any other suitable dimensions than those described above.

FIG. 3A also shows a plurality of electronic-circuit components 22 electrically coupled to the one or more electrically conductive traces 26 of core strip 25, in an interior portion of yarn 16B. The electronic-circuit components, which may include discrete or integrated electronic-circuit elements, may be coupled to the electrically conductive traces via an electrically conductive adhesive, reflow soldering, or other suitable method. At least one electrically contactable terminal 30 is arranged at terminus 32 of the conductive traces 26. The terminal enables the various electronic-circuit components of electronically functional yarn 16B to be addressed and/or powered (vide infra). In some examples, an electrically contactable terminal 30 may take the form of a cut end of one of the conductive traces 26, which may be cut anywhere along the length of the yarn.

In other examples, as shown in FIG. 4A, a conductive trace 26A may include regularly spaced conductive pads 28, where the trace widens over a length of a few millimeters and then returns to its nominal width. Cutting the yarn across a conductive pad 28 will expose a larger area for potential contact, through which the electronically functional yarn may be addressed and/or powered. In still other examples, the addressable portions of the conductive traces (pads or regions of nominal width) may be exposed not by cutting, but by unraveling a portion of the yarn to expose the locus of core strip 25A where contact is desired. In some implementations, conductive fibers, filaments, or other types of electrical wires may be attached to the contactable terminals via soldering or welding, or with the aid of a conductive adhesive. Such wires may be wound around the yarn and may be exposed at the extremities of the yarn. The wires may then be connected to an external circuit that provides, power, signal, and/or signal reception.

In other examples, as shown in FIG. 4B, conductive traces 26B need not be continuous over the entire length of core strip 25B, but may be arranged in discrete, electrically isolated, and regularly spaced units. The yarn may be cut between these units to form individual core strips for incorporation into yarn.

Returning briefly to FIG. 3A, the electronically functional yarn core 24 also includes a carrier thread 33 to provide mechanical strength during winding, spinning, weaving, etc. In some examples, the carrier thread 33 may comprise a plurality of wound fibers filaments. In other examples, the carrier thread 33 may comprise a single, mechanically robust filament. The carrier thread 33 may be attached to core strip 25 in any of a variety of ways. In some implementations, the carrier thread 33 may be attached to the core strip 25 using a flexible adhesive, such as a pressure sensitive adhesive or a curable adhesive. In other implementations, the carrier thread 33 may be formed from a thermoplastic material and bonded to the core strip 25 via the application of heat (and potentially with the application of suitable pressure). FIG. 3B provides a cross-sectional, schematic view of the yarn core 25, core strip 25, and carrier thread 33, in one non-limiting example. In yet other examples, the carrier thread 33 may be omitted.

Electronically functional yarn 16B may also include one or more windings wrapped or spun around the core strip 25 and carrier thread 33. The windings may include electronically non-functional fibers. For clarity, FIG. 3A shows one such winding 34, but in practice many fibers may be wound around the core strip. In other examples, a plurality of non-functional, non-fibrous filaments may be wound around the core strip instead of, or in addition to, the electronically non-functional fibers. Suitable electronically non-functional fibers include raw fibers of wool, flax, cotton, hemp, and synthetic polymers. Suitable non-fibrous filaments include natural silk as well as synthetics. Further, as mentioned above, in some examples, the windings may include a conductive filament or thread that interfaces with electrically conductive traces on the yarn core. In still other examples, conductive filaments may be wound around the core, then other fibers or filaments may be wound around the wrapped-core structure, thereby concealing the core and the conductive filaments wrapped around it.

Figure 5:
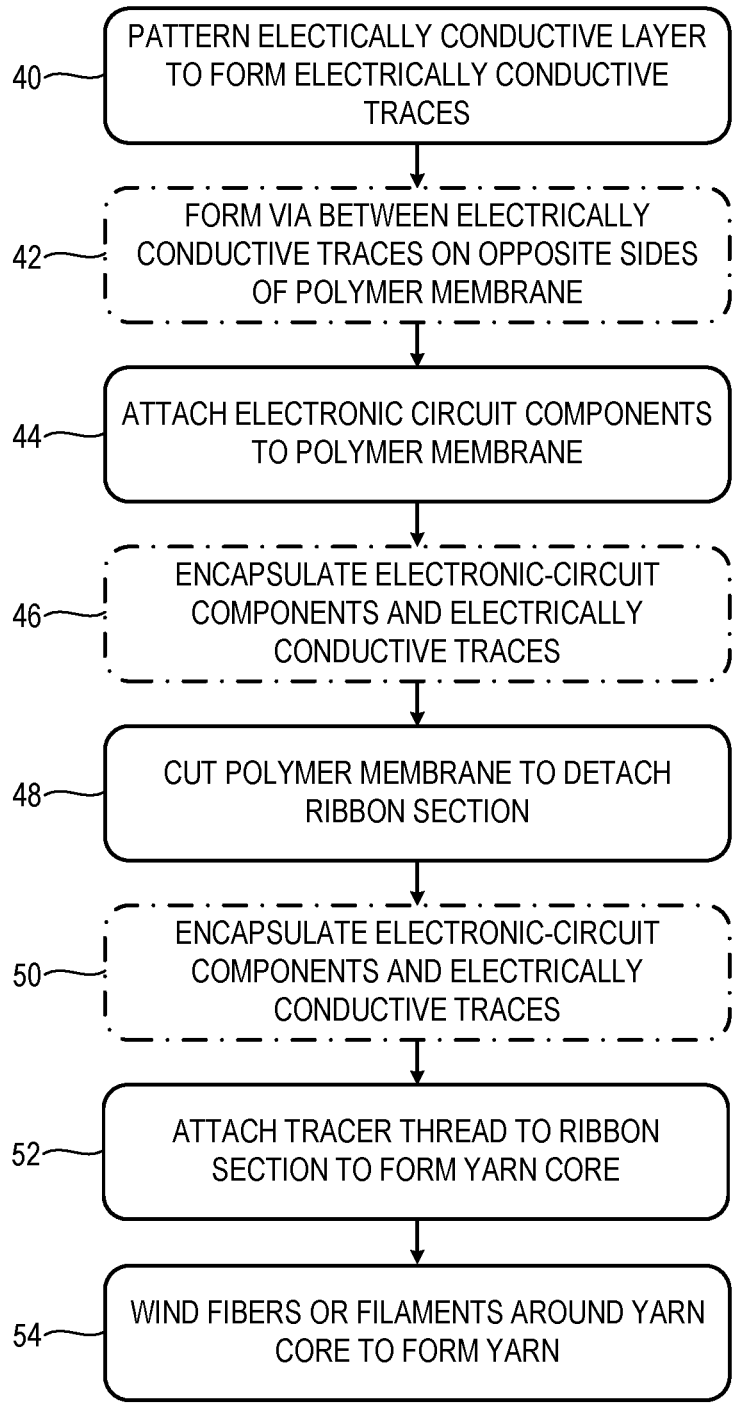
FIG. 5 illustrates an example method to make an electronically functional yarn.

FIG. 5 illustrates an example method 36 to make an electronically functional yarn 16B. At 40, an electrically conductive cladding layer of a conductor-clad polymer membrane sheet is patterned to form an array of electrically conductive traces on the polymer sheet. The conductor-clad polymer sheet may comprise, for example, a flexible polymer sheet coated on one or both sides with a thin layer of a conductor such as copper. In some examples, photolithography may be used to pattern the electrically conductive surface layer of the conductor-clad polymer sheet. The photolithography process may include application of a photoresist and selective curing of the photoresist by UV irradiation through a photomask. This process may be followed by a chemical etch to remove the copper from between the traces. In other examples, a resist may be applied via a stencil and cured without the aid of a mask. In still other examples, a screen-printing technique may be used to apply and/or pattern the conductive traces onto a polymer sheet. In some examples, the patterning aspect may include an optional step in which the electrically conductive traces formed by wet etching are overplated with nickel, tin, and/or another material, to discourage oxidation, improve strength, etc. The optional overplating step may include electroplating, electroless plating, or spray coating, as examples.

As noted hereinabove, the conductor-clad polymer sheet used to form core strip 25 may have opposing first and second sides, with an electrically conductive surface layer provided on each of the first and second sides. Here, method 36 may include an optional step 42 of forming a via between the electrically conductive surface layer of the first side and the electrically conductive surface layer of the second side. A via may be formed, for example, by laser ablation (laser drilling) of a small locus of the patterned polymer sheet. The ablated locus may extend from a conductive trace on one side of the sheet to a conductive trace on the opposite side of the sheet. The ablated hole may then be filled with solder, conductive adhesive, or the like. In other examples, die punching may be used in lieu of laser ablation.

At 44 of method 36, a plurality of electronic-circuit components are attached to the array of electrically conductive traces. The electronic components may be attached using a conductive adhesive, reflow soldering, etc. In method 36, the electronic-circuit components and conductive traces may be encapsulated to avoid detachment or damage during subsequent winding of the electronically functional yarn. Suitable encapsulants may include a polyurethane, polysiloxane, and/or epoxy-amine resin that remains flexible upon curing. In some examples, encapsulation may occur at 46, prior to cutting the sheet (with components attached) into sections.

At 48 the surface-modified polymer sheet is cut, thereby detaching strip of the patterned polymer sheet. The strip detached in this manner still supports the one or more of the electrically conductive traces, which are distributed over at least a portion of a length of the strip, and one or more of the electronic-circuit components arranged on an interior portion of the strip. Mechanical micro-machine cutting and/or laser ablation (laser machining) may be used to cut away the section, as examples. At 50 of method 36 an optional encapsulation step may be used. Encapsulation after the cutting may be used, for example, when a continuous film of robust encapsulant over the entire surface of the core strip is desired. A plurality of strips may be cut from the patterned polymer sheet in this manner to form a plurality of yarn cores.

At 52 the encapsulated core strip is attached to a carrier thread, which provides mechanical robustness during subsequent spinning of the various electronically non-functional fibers and/or filaments around the core strip. In some implementations, the carrier thread may be secured to the core strip using an adhesive, such as a curable material or a pressure-sensitive adhesive. In other examples, the carrier thread may be formed from a thermoplastic material that can be bonded via heat to the core strip. Further, in some examples, the core strip may be attached to a carrier thread at a different location in the process than that shown in FIG. 5.

At 54, a plurality of fibers and/or filaments (as described above) are wound around the yarn core to form an electronically functional yarn. It will be noted that method 36 may be enacted in a roll-to-roll process, for efficiency of manufacture.

Figure 6:
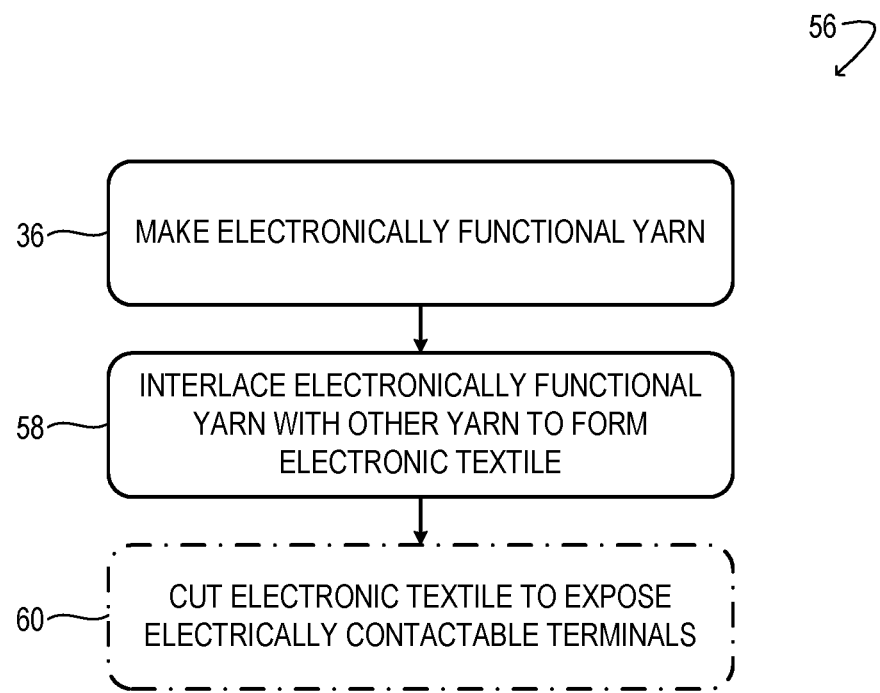
FIG. 6 illustrates an example method to make an electronically functional textile.

FIG. 6 illustrates an example method 56 to make an electronic textile using an electronically functional yarn, such as the yarn made in method 36 of FIG. 5. At 36 of method 56, an electronically functional yarn is made. In some examples, a process other than method 36 may be used to form the electronically functional yarn. At 58 the electronically functional yarn is interlaced with the same or different yarns to form the electronic textile. Interlacing the yarns may include one or more of weaving, knitting, crocheting, bonding, knotting, felting, and embroidering. At optional step 60, the electronic textile is cut. In cutting the electronic textile, the electronically functional yarn and associated strip are segmented to expose at least one electrically contactable terminal, which may simply be a terminus of the one or more conductive traces, or may comprise a conductive pad. One or more of these terminals may be connected to a source of power or electronic signal, or to a signal receiver. In other examples, the electronic componentry of the yarn may be addressed and/or powered via unwidened traces or conductive pads arranged on an interior portion of the strip (away from any locus where the yarn is cut). As noted above, conductive traces or pads may be exposed by unraveling a small portion of the yarn where contact is desired. In other implementations, as noted above, the conductive pads may be attached to conductive filaments, fibers, or wires generally. Such wires may be unraveled and exposed at the ends of any segment of electronically functional yarn.

Figure 7:
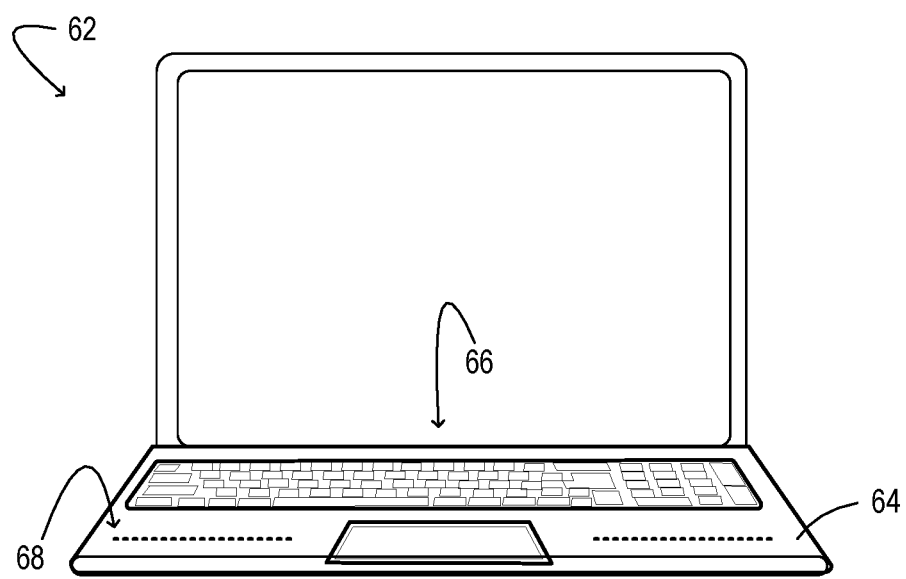
FIG. 7 shows another example electronically functional textile article in the form of a portable computer having a fabric cover.
Figure 8:
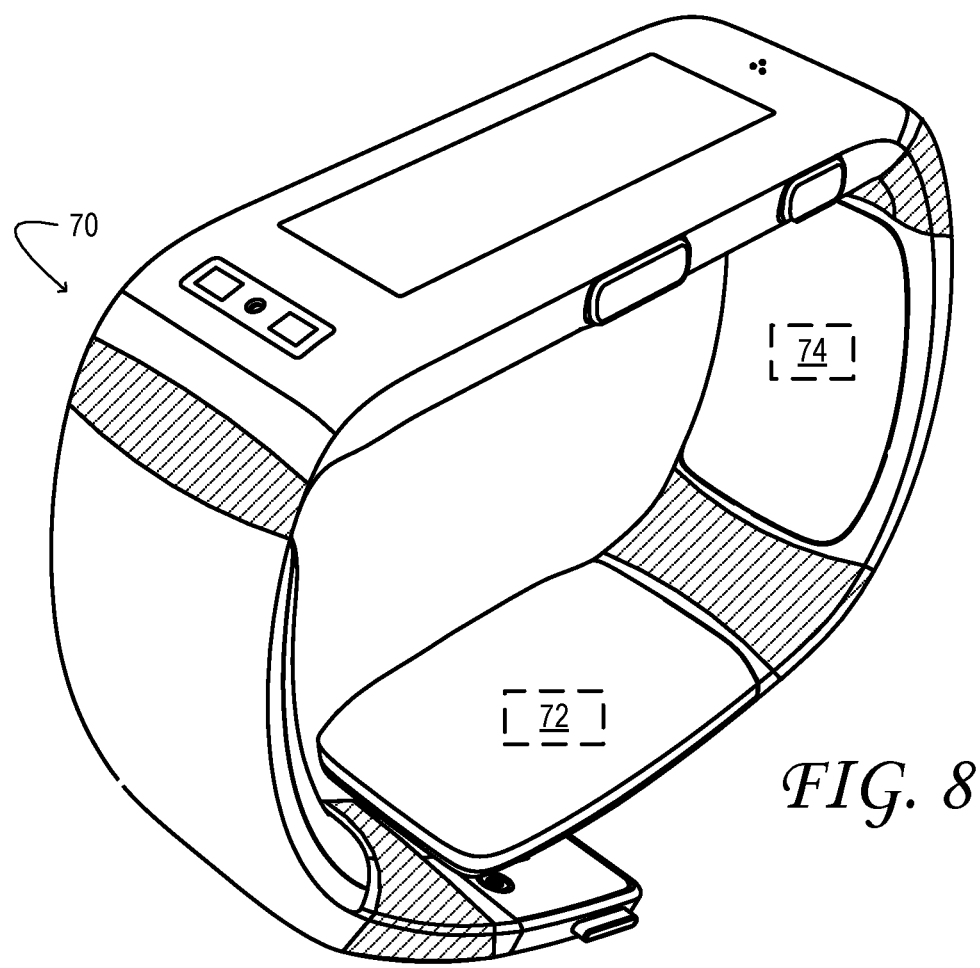
FIG. 8 shows another example electronically functional textile article in the form of a wrist-worn item.

As mentioned above, an electronic textile may be used in a wide variety of settings. FIGS. 7 and 8 depict other examples of devices that may incorporate electronic textiles as disclosed herein. First, FIG. 7 shows an example computing device 62 in the form of a portable computer including a fabric-covered body 64 surrounding a keyboard 66 of the device. Fabric-covered body 64 may comprise various sensors and/or output devices incorporated directly into the electronic textile forming the body, examples of which are indicated by light sources 68 (e.g., bare LED dies mounted to a yarn core of a yarn incorporated into the electronic textile). Touch-sensing functionality also may be implemented directly in the fabric, e.g. via conductive yarn cores arranged as a capacitive sensing array. FIG. 8 shows an example wrist-worn device 70 comprising one or more areas that may incorporate an electronic textile comprising one or more sensors and output devices. For example, wrist-worn device 70 may comprise an optical pulse-rate sensor 72 with yarn-embedded LEDs and photodiodes, and a galvanic skin-response sensor 74 with yarn-embedded electrical-impendence sensors.

One aspect of this disclosure is directed to a yarn adaptable to incorporation into a textile, the yarn comprising: a core comprising a polymer strip with one or more electrically conductive traces arranged on the polymer strip and distributed over at least a portion of the length of the yarn; an electrically contactable terminal arranged at a terminus of the one or more conductive traces; and a winding wound around the core.

In some implementations, the core further comprises a carrier thread attached to the polymer strip over at least a portion of the length of the yarn. In some implementations, the polymer strip has opposing sides and supports one or more electrically conductive traces on each of the opposing sides. In some implementations, the winding comprises one or more of a fiber and a filament. In some implementations, the polymer strip comprises an elastomer. In some implementations, the polymer strip is 100 to 1000 microns wide and 50 to 100 microns in thickness. In some implementations, the electrically conductive traces comprise copper.

Another aspect of this disclosure is directed to an electronic textile comprising: a yarn including a core comprising a polymer strip with one or more electrically conductive traces arranged on the section and distributed over a length of the yarn, and carrier thread attached to the polymer strip over at least a portion of the length of the yarn; an electrically contactable terminal arranged at a terminus of the one or more conductive traces of the core; an electronic-circuit component electrically coupled to the one or more electrically conductive traces of the core in an interior portion of the yarn; and a winding wound around the core.

In some implementations, the electronic-circuit component includes one or more of a discrete electronic-circuit element and an integrated electronic-circuit component.

Another aspect of this disclosure is directed to a method to make an electronic textile, the method comprising: patterning an electrically conductive surface layer of a conductor-clad polymer strip to form an array of electrically conductive traces on the polymer strip; attaching a plurality of electronic-circuit components to the array of electrically conductive traces; and cutting the polymer strip to detach a section of the polymer strip, with one or more of the electrically conductive traces on the section, and one or more of the electronic-circuit components arranged on an interior portion of the section; and spinning a plurality of windings around the section of the polymer strip.

In some implementations, the method further comprises attaching a carrier thread to the section of the polymer strip. In some implementations, the method further comprises depositing an electrically conductive layer onto a polymer sheet to form the conductor-clad polymer strip. In some implementations, patterning the electrically conductive surface layer includes patterning by photolithography. In some implementations, the conductor-clad polymer strip has opposing first and second sides and an electrically conductive surface layer on each of the first and second sides, the method further comprising forming a via between the electrically conductive surface layer of the first side and the electrically conductive surface layer of the second side. In some implementations, cutting the polymer strip includes one or more of mechanical and laser cutting. In some implementations, the method further comprises encapsulating the electronic-circuit components and conductive traces prior to the cutting. In some implementations, the method further comprises encapsulating the electronic-circuit components and conductive traces after the cutting. In some implementations, spinning the winding comprises winding one or more of a fiber and a filament around the section to form a yarn. In some implementations, the method further comprises interlocking the yarn with a same or different yarn to form the electronic textile. In some implementations, interlocking the yarn includes one or more of weaving, knitting, and embroidering.

It will be understood that the configurations and/or approaches described herein are exemplary in nature, and that these specific examples or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A yarn for incorporation into a textile, the yarn comprising:
   a core including a polymer strip, with one or more electrically conductive traces arranged on the polymer strip and distributed over at least a portion of a length of the yarn, and a carrier thread attached to the polymer strip over at least the portion of the length of the yarn, the carrier thread being configured to strengthen the core to enable spinning of one or more windings around the core;
   an electrically contactable terminal arranged at a terminus of the one or more conductive traces; and
   an electronically nonfunctional winding spun around the core.

2. The yarn of claim 1 wherein the polymer strip has opposing sides and supports one or more electrically conductive traces on each of the opposing sides.

3. The yarn of claim 1 wherein the electronically nonfunctional winding comprises one or more of a fiber and a filament.

4. The yarn of claim 1 wherein the polymer strip comprises an elastomer.

5. The yarn of claim 1 wherein the polymer strip is 100 to 1000 microns wide and 50 to 100 microns in thickness.

6. The yarn of claim 1 wherein the electrically conductive traces comprise copper.

7. An electronic textile comprising:
   a yarn including a core including a polymer strip, with one or more electrically conductive traces arranged on a section of the polymer strip and distributed over at least a portion of a length of the yarn, and a carrier thread attached to the polymer strip over at least a portion of the length of the yarn, the carrier thread being configured to strengthen the core to enable spinning of one or more windings around the core;
   an electrically contactable terminal arranged at a terminus of the one or more conductive traces of the core;
   an electronic-circuit component electrically coupled to the one or more electrically conductive traces of the core in an interior portion of the yarn; and
   an electronically nonfunctional winding spun around the core.

8. The electronic textile of claim 7 wherein the electronic-circuit component includes one or more of a discrete electronic-circuit element and an integrated electronic-circuit component.

9. A method to make an electronic textile, the method comprising:
- patterning an electrically conductive surface layer of a conductor-clad polymer strip to form a yarn core comprising an array of electrically conductive traces on the polymer strip, the array of electrically conductive traces being distributed over at least a portion of a length of the yarn core, wherein an electrically contactable terminal is arranged at a terminus of the array of electrically conductive traces;
- attaching a plurality of electronic-circuit components to the array of electrically conductive traces; and
- cutting the polymer strip to detach a section of the polymer strip, with one or more of the electrically conductive traces on the section, and one or more of the electronic-circuit components arranged on an interior portion of the section
- attaching a carrier thread to the section of the polymer strip, the carrier thread being configured to strengthen the core to enable spinning of one or more windings around the yarn core; and
- spinning a plurality of electronically nonfunctional windings around the section of the polymer strip.

10. The method of claim 9 further comprising depositing an electrically conductive layer onto a polymer sheet to form the conductor-clad polymer strip.

11. The method of claim 9 wherein patterning the electrically conductive surface layer includes patterning by photolithography.

12. The method of claim 9 wherein the conductor-clad polymer strip has opposing first and second sides and an electrically conductive surface layer on each of the first and second sides, the method further comprising forming a via between the electrically conductive surface layer of the first side and the electrically conductive surface layer of the second side.

13. The method of claim 9 wherein cutting the polymer strip includes one or more of mechanical and laser cutting.

14. The method of claim 9 further comprising encapsulating the electronic-circuit components and conductive traces prior to the cutting.

15. The method of claim 9 further comprising encapsulating the electronic-circuit components and conductive traces after the cutting.

16. The method of claim 9 wherein spinning the plurality of electronically nonfunctional windings comprises winding one or more of a fiber and a filament around the section to form a yarn.

17. The method of claim 16 further comprising interlocking the yarn with a same or different yarn to form the electronic textile.

18. The method of claim 17 wherein interlocking the yarn includes one or more of weaving, knitting, and embroidering.

* * * * *